United States Patent [19]

Hirose et al.

[11] Patent Number: 4,923,764
[45] Date of Patent: May 8, 1990

[54] ARTICLE OF BLACK SILVER COLOR

[75] Inventors: Kouji Hirose; Hitoshi Ito; Kazuhito Yoshida, all of Tokyo, Japan

[73] Assignee: Seikosha Co., Ltd, Japan

[21] Appl. No.: 91,650

[22] Filed: Sep. 1, 1987

[30] Foreign Application Priority Data

Sep. 2, 1986 [JP] Japan ................................ 61-206529

[51] Int. Cl.$^5$ ............................................. B32B 15/04
[52] U.S. Cl. .................................... 428/632; 428/666; 428/680; 428/697; 428/702
[58] Field of Search ............... 428/623, 628, 632, 697, 428/702, 666, 680

[56] References Cited

U.S. PATENT DOCUMENTS

| | | | |
|---|---|---|---|
| 3,958,070 | 5/1976 | Schintlmeister et al. | 428/457 |
| 4,717,632 | 1/1988 | Keem et al. | 428/698 |
| 4,808,490 | 2/1989 | Tsukuda et al. | 428/697 |

FOREIGN PATENT DOCUMENTS

| | | | |
|---|---|---|---|
| 2528255 | 2/1976 | Fed. Rep. of Germany | 428/627 |
| 200948 | 10/1985 | Japan | 428/621 |

*Primary Examiner*—L. Dewayne Rutledge
*Assistant Examiner*—George Wyszomierski
*Attorney, Agent, or Firm*—Bruce L. Adams; Van C. Wilks

[57] ABSTRACT

An article having a colored surface comprises an article having a working surface and a coating applied on the working surface comprising a cermet composed of alumina and one of chromium and nichrome and exhibiting a black silver color.

12 Claims, No Drawings

ARTICLE OF BLACK SILVER COLOR

BACKGROUND OF THE INVENTION

This invention concerns an article of black silver color applicable to exterior parts, spectacle frames, stationeries, personal ornaments and various kinds of accessories.

Heretofore, the following chemical treatment has been known as one of the methods for obtaining a high quality dark silver color. This is a chemical treatment of immersing a material previously coated with a metal such as zinc, aluminum and nickel or the metal material per se such as zinc, aluminum and nickel into a solution mainly composed of sodium chromate or sodium bichromate and thereby forming a chromium oxide layer on the surface. It has been also known to use a chemical treatment of immersing material, previously coated with a metal such as zinc, aluminum and nickel or the metal material itself such as zinc, aluminum and nickel, into a solution composed of a nickel chloride solution with hydrogen sulfide, thereby forming a nickel sulfide coating layer on the surface.

These known chemical treatments are restricted in view of the material, the layer thickness of the coating layer formed thereby is extremely thin being at most about 0.1 $\mu$m, and the coating layer lacks a dense texture. Accordingly, there has been a problem such relating to corrosion resistance and abrasion resistance.

SUMMARY OF THE INVENTION

An object of this invention is to provide an article of black or dark silver color with metallic gloss of a highly decorative nature and excellent in corrosion resistance, abrasion resistance and close bondability.

Another object of the present invention is to provide an article having such a color tone with a good reproducibility and at a reduced cost.

DETAILED DESCRIPTION OF THE INVENTION

The feature of the present invention resides in that a cermet comprising metal chromium and alumina or metal nichrome and alumina is coated on the surface.

In the article of black or dark silver color according to the present invention, the cermet comprising metal chromium and alumina or metal nichrome and alumina formed on the surface exhibits a black silver color of metallic gloss, and has a highly decorative nature by providing a gracious and high quality feeling. The cermet coating layer has a high density, is excellent in corrosion resistance, abrasion resistance and close bondability and can be coated uniformly with good reproducibility. Moreover, the range for selecting the material of the object is wide, and coating can be applied with ease and is provided at a reduced cost.

EXAMPLE

For obtaining such a coating layer, the present inventors have noted and studied a composite cermet of metal-oxide.

In the case of forming a composite cermet of metal-oxide ceramics as a coating layer material, it is desirable that the composition assuming metal as X and oxide ceramics as $Y_{x2}O_{y2}$ can satisfy the following relationship in view of the formation free energy:

$$|X_{x1}O_{y1}| < |Y_{x2}O_{y2}| \tag{1}$$

This means that the metal constituting the cermet does not reduce the oxide ceramics upon sputtering. If the reduction proceeds during sputtering, conversion of cermet into ceramics proceeds and, as a result, the optical transparency of the material for the coating layer is increased, causing interferences of light in the coating layer formed to the material thus making it difficult to form a uniform color tone as the decorative coating layer, as well as making it difficult to reproduce an identical color tone.

Further, considering not only the decorative property but also the corrosion resistance and abrasion resistance, chromium Cr and nichrome (Ni+Cr) have been selected at first as the metal.

As for the oxide ceramic capable of satisfying the relationship defined by the equation (I) with respect to chromium or nichrome, there can be mentioned zirconium oxide, vanadium oxide, alumina, niobium oxide and tantalum oxide, and the formation free energy has the relationship as shown below.

$$|ZrO_2| < |V_2O_5| < |Al_2O_3| < |Nb_2O_5| < |Ta_2O_5| \tag{2}$$

In this case, while the equation (I) can be satisfied for $ZrO_2 \cdot V_2O_5$, the reaction proceeds more or less during sputtering, thereby tending to cause a little loss in the uniformity of the tone. Further, the reaction does not occur substantially in the sputtering for $Nb_2O_5$ and $Ta_2O_5$, and the coating layer thereof has less difference in the tone as compared with the coating layer of chromium or nichrome alone and causes no peculiarity as the decorative coating layer.

As a result of studying the foregoing collectively, chromium or nichrome was adopted as the metal, and alumina $Al_2O_3$ was adopted as the oxide ceramic.

Details will now be described specifically hereinafter.

Example 1

A decoration casing made of ABS resin was placed in a high frequency magnetron sputtering device and a composite target comprising 70% of chromium and 30% by weight of alumina was used as a target. After reducing the pressure in the device to a vacuum of about $(1.0-2.0) \times 10^{-3}$ Pa, argon gas was applied to increase the pressure to $(6.0-7.0) \times 10^{-1}$ Pa. Then sputtering was applied at a high frequency output of 8 Watt/cm$^2$. The film forming rate was 0.78 $\mu$m/hr and the thickness of the coating layer thus formed was 0.2 $\mu$m.

The temperature of the material heated during film formation remained from room temperature up to 50° C., the material caused no thermal deformation and showed good close bondability and a highly decorative black or dark silver coating layer having metal gloss could be formed.

Example 2

Metal chromium and alumina were disposed separately as targets, shutters were attached on both of the targets and sputtering was applied while controlling the alumina ingredient ratio to 30% by weight by the opening degree for both of the shutters. Other conditions were the same as those in Example 1 and the coating layer thus formed was also as described above.

Example 3

Sputtering was applied using a composite target comprising 70% by weight of nichrome and 30% by weight of alumina as a target and under the same conditions as in Example 1. The thus formed coating layer was a highly decorative black or dark silver layer, satisfactory in the close bondability and excellent in corrosion resistance.

Although the composition for nichrome was set to 80% nickel and 20% chromium in this example, it is not restricted only to this composition. In the case of placing nichrome and alumina in separate targets and applying sputtering in the same manner as in Example 2, a satisfactory factory coating layer similar to that in the above-mentioned example could be obtained.

In any of the examples, the coating layer had an intense metallic nature and was excellent in the close bondability with the material within a range of the alumina ingredient ratio of from 5 to 50% by weight.

Although sputtering was shown as an example for the coating in the above-mentioned examples, it can be applied also by the vacuum deposition or ion plating.

In the case of using EB (electron beam) for the evaporization source, both in the vacuum deposition and ion plating, two electron guns and crucibles are disposed respectively in one device and ion plating was applied for chromium, (or nichrome) and alumina independently under appropriate conditions for the evaporization rate to form a layer. In this case, it is necessary to set the conditions for the evaporation rate such that the alumina ingredient ratio in the layer is within a range from 5 to 50% by weight. In the case of using each one electron gun and crucible, a target previously set to a proper ingredient ratio may be placed and evaporated simultaneously. The material to which the present invention is applied can be made of synthetic resin, metal or ceramic, etc. with no particular restriction and it is of course possible to apply plating such as nickel plating or chromium plating to the material and, thereafter, apply the coating of the present invention. Alternatively, it is also possible to previously coat metal such as chromium, nichrome and nickel to the material by way of sputtering, vacuum deposition or ion plating and, thereafter, apply the coating of the present invention successively. That is, with an aim of improving the close bondability or, particularly, in a case where the material is a metal of poor corrosion resistance, a primer coating layer made of a metal or ceramic layer may be disposed between the material and the present coating layer also with an aim of improving the corrosion resistance.

Upon coating, the alumina ingredient ratio is determined to such an extent that the optical transparency of the formed layer does not lose the decorative nature and the tone is apparently different the case of using chromium or nichrome alone. A most desired tone is obtained with the alumina ingredient ratio in a range from 5 to 50% by weight.

What is claimed is:

1. An article of dark silver color, said article having a surface and comprising a composite material defining a cermet composed of metal chromium and alumina, or metal nichrome and alumina coated on the surface, said cermet having 5 to 50% by weight of alumina, and said composite material being such that the alumina therein is not substantially reduced by the metal during application thereof to said surface.

2. An article of dark silver color as defined in claim 1, wherein the coating has been formed by the process of vapor deposition, sputtering or ion plating.

3. An article of dark silver color as defined in claim 1, wherein the material of the article comprises synthetic resin, metal or ceramic, and a primer coating of nickel or chromium has been formed on the surface of the material by the process of plating or coating.

4. An article having a colored surface, said article having a working surface and a cermet composed of alumina and one of chromium and nichrome applied as a coating on said working surface and exhibiting a silver color, said alumina being present in an amount 5 to 50% by weight of the coating, and said coating being such that the alumina therein is not substantially reduced by the metal during application thereof to said working surface.

5. An article according to claim 4, wherein the coating has been applied by one of vapor deposition, sputtering and ion plating.

6. An article according to claim 4, wherein the working surface of the article comprises one of nickel, chromium and nichrome.

7. An article according to claim 4, wherein the coating comprises a vapor deposited coating.

8. An article according to claim 4, wherein the coating comprises a sputtered coating.

9. An article according to claim 4, wherein the coating comprises an ion plated coating.

10. An article according to claim 4, wherein the alumina is present in an amount about 30% by weight of the coating.

11. An article according to claim 10, wherein the coating has a thickness about 0.2 $\mu$m.

12. An article according to claim 4, wherein the coating has a thickness about 0.2 $\mu$m.

* * * * *